United States Patent
Masumoto

[11] Patent Number: 5,996,101
[45] Date of Patent: Nov. 30, 1999

[54] TEST PATTERN GENERATING METHOD AND TEST PATTERN GENERATING SYSTEM

[75] Inventor: Takehiro Masumoto, Tokyo, Japan

[73] Assignee: NEC Corporation, Tokyo, Japan

[21] Appl. No.: 08/751,727

[22] Filed: Nov. 18, 1996

[30] Foreign Application Priority Data

Nov. 17, 1995 [JP] Japan .................................. 7-323624

[51] Int. Cl.⁶ .................................................. G06F 11/00
[52] U.S. Cl. ............................................. 714/738; 714/25
[58] Field of Search .................... 371/27, 22.1; 364/550, 364/580, 578; 324/500, 512, 765, 73.1; 714/25, 32, 39, 48, 733, 738, 739, 741, 745

[56] References Cited

U.S. PATENT DOCUMENTS

| | | | |
|---|---|---|---|
| 5,257,268 | 10/1993 | Agrawal et al. | 371/27 |
| 5,291,495 | 3/1994 | Udell, Jr. | 371/22.3 |
| 5,390,193 | 2/1995 | Millman et al. | 371/27 |
| 5,410,552 | 4/1995 | Hosokawa | 371/27 |
| 5,588,008 | 12/1996 | Nakata | 371/27 |
| 5,648,975 | 7/1997 | Deguchi | 371/27 |

FOREIGN PATENT DOCUMENTS

| | | |
|---|---|---|
| 0342787 | 11/1989 | European Pat. Off. . |
| 4-111134 | 4/1992 | Japan . |
| 5-250434 | 9/1993 | Japan . |
| 5-341011 | 12/1993 | Japan . |
| 6-102321 | 4/1994 | Japan . |
| 6-138183 | 5/1994 | Japan . |
| 7-27834 | 1/1995 | Japan . |
| 7-191102 | 7/1995 | Japan . |
| 7-323624 | 4/1998 | Japan . |
| WO 94 23368 | 10/1994 | WIPO . |

*Primary Examiner*—Robert W. Beausoliel, Jr.
*Assistant Examiner*—Nadeem Iqbal
*Attorney, Agent, or Firm*—Sughrue, Mion, Zinn, Macpeak & Seas, PLLC

[57] ABSTRACT

A test pattern generating method for a logical circuit comprises selecting failures to be detected in the logical circuit on which a test pattern is generated, selecting a target failure from all failures selected, generating a test pattern for detecting the target failure, performing a failure simulation on all selected failures by the generated test pattern, selecting the target failure from the failures not detected by the test pattern, and deleting a redundancy test pattern, which has a low failure detection rate, from the test patterns for detecting all failures.

13 Claims, 8 Drawing Sheets

FIG. 5

FAILURE TABLE 500

| PATTERN | TARGET FAILURE | f1 | | f2 | | f3 | | f4 | | f5 | | f6 | | f7 | | f8 | | f9 | | f10 | | f11 | |
|---|---|---|---|---|---|---|---|---|---|---|---|---|---|---|---|---|---|---|---|---|---|---|---|
| | | sa0 | sa1 | sa0 | sa1 | sa0 | sa1 | sa0 | sa1 | sa0 | sa1 | sa0 | sa1 | sa0 | sa1 | sa0 | sa1 | sa0 | sa1 | sa0 | sa1 | sa0 | sa1 |
| 1001 | f1/sa0 | dat | | dat | | dat | | | | | | | | | | | | | | | | | |
| ~~0000~~ | f1/sa1 | | dat | | dat | | dat | | dat | | | | | | | | | | | | | | |
| 0001 | f2/sa1 | | dat | | dat | | dat | | dat | | | | | | | | | | | | | | |
| ~~1010~~ | f3/sa1 | | dat | | | | dat | | dat | | | | | | | | | | | | | | |
| 1110 | f4/sa0 | dat | | | | | | dat | | dat | | dat | | | | | | dat | | | | | |
| 1100 | f7/sa1 | | dat | | | | | | | | dat | | dat | | dat | | dat | | | | | | dat |
| 1011 | f8/sa0 | | dat | | | | | | | | dat | | | | dat | | dat | | | | dat | | dat |

DELETE

FIG. 8 (PRIOR ART)

FAILURE TABLE

TEST PATTERN GENERATING METHOD AND TEST PATTERN GENERATING SYSTEM

BACKGROUNDS OF THE INVENTION

1. Field of the Invention

The present invention relates to a method for generating a failure detection test pattern for detecting a failure in a logical circuit and a test pattern generating system, and more particularly to a failure detection test pattern generating method which can shorten time required for the pattern generation and reduce the test pattern number and a test pattern generating system.

2. Description of the Related Art

In a conventional generation of the above type of test pattern, "test pattern generating process" for generating a test pattern to detect a single target failure which is determined in a circuit diagram and "failure simulation" for determining a failure which is detected by a given test pattern are performed.

Such a conventional test pattern generating method has disadvantages that when a test pattern for obtaining a high failure detection rate is generated, the possibility of increasing the total number of test patterns generated (test pattern length becomes long) becomes high and it is hard to shorten the test time.

In order to remedy the above disadvantages, for example, Japanese Patent Laid-Open Publication (Kokai) No. Heisei 5-341011 proposes a test pattern generating method which performs the test pattern generation and the failure simulation in combination. This test pattern generating method determines a single failure as a target failure, and when a pattern for detecting the target failure is obtained in multiple numbers by the test pattern generation, selects several patterns from the obtained patterns, performs the failure simulation on respective patterns, and determines a pattern, which can detect most failures at the time, among the obtained results as the test pattern with respect to the target failure, thereby enabling to decrease the total number of test patterns (test pattern length).

Now, description will be made of the test pattern generating method described in the above-described Japanese Patent Laid-Open Publication No. Heisei 5-341011 with reference to the flowchart of FIG. 6 and the circuit diagram of FIG. 7 which shows an example of the logical circuit on which the test patterns are generated. The logical circuit of FIG. 7 comprises a first AND gate G701 having inputs i2, i3 as input, a second AND gate G703 having a reverse signal of the input i3 from an inverter G702 and an input i4 as input, an OR gate G704 having the first and second AND gates G701, G703 as input, and a third AND gate G705 having an input i1 and the output of the OR gate G704 as input.

First, a failure table 800 is prepared as shown in FIG. 8 in step 601. It is judged in step 602 whether or not all failures are detected, and if not, a single failure target is taken from undetected failures and determined as a target failure (step 603). First, a 0 degeneracy failure at an output f1 (stuck-at-0, hereinafter referred to as "f1/sa0") of the gate G705 is determined to be a target failure.

It is judged in step 604 whether or not the failure f1/sa0 has been detected, and if not, a test pattern for detecting the failure f1/sa0 is generated in step 605. In the logical circuit shown in FIG. 7, test patterns by which the failure f1/sa0 is detected are four of (i1, i2, i3, i4)=(1, 0, 0, 1), (1, 1, 0, 1), (1, 1, 1, 0) and (1, 1, 1, 1).

Since multiple test patterns are generated (step 606), the respective test patterns are subjected to the failure simulation (step 610), and respective failure detection numbers are recorded (step 611).

Then, a test pattern (1, 0, 0, 1) which has the most failure detection numbers is selected (step 612), and the failure table 800 is renewed (step 608).

A 1 degeneracy failure at the output f1 (stuck-at-1, hereinafter referred to as "f1/sa1") of the gate G705 is taken from the undetected failures and determined as a target failure (step 603). It is judged in step 604 whether or not the failure f1/sa1 has been detected, and if not, a test pattern for detecting the failure f1/sa1 is generated in step 605.

Test patterns by which the failure f1/sa1 is detected are 12 of (i1, i2, i3, i4)=(0, 0, 0, 0), (0, 0, 0, 1), (1, 0, 1, 0), (1, 0, 1, 1), (1, 1, 0, 0), (0, 0, 1, 0), (0, 0, 1, 1), (0, 1, 0, 0), (0, 1, 0, 1), (0, 1, 1, 0), (0, 1, 1, 1) and (1, 0, 0, 0). Since multiple test patterns are generated (step 606), the respective test patterns are subjected to the failure simulation (step 610), and the respective failure detection numbers are recorded (step 611).

Then, a test pattern (1, 0, 1, 1) which has the most failure detection numbers is selected (step 612), and the failure table 800 is renewed (step 608).

According to the flowchart shown in FIG. 6, the above-described respective steps are repeated until all failures are detected (step 602).

By the above process, the conventional test pattern generating method can detect a 0 degeneracy failure (sa0) and a 1 degeneracy failure (sa1) at inputs and outputs f1 to f11 of all gates by five test patterns (i1, i2, i3, i4)=(1, 0, 0, 1), (1, 0, 1, 1), (0, 0, 0, 1) and (1, 1, 0, 0) as shown in FIG. 8.

The above-described test pattern generating method needs to generate multiple test patterns with respect to a single target failure and, when the multiple test patterns are obtained, needs to perform the failure simulation on all the test patterns, so that it has a disadvantage that the time required to perform the failure simulation becomes enormous. Especially, large-scaling of semiconductor ICs and expansion of the failure simulation (namely, prolonging of the test pattern generating time) are serious issues.

SUMMARY OF THE INVENTION

A first object of the present invention is to provide a test pattern generating method which decreases test pattern generating time and reduces the test pattern numbers generated in generating a failure detection test pattern for a logical circuit and a test pattern generating system.

A second object of the present invention is to provide a test pattern generating method which can shorten the time required for generating a test pattern by decreasing the number of failure simulation times without lowering a failure detection rate and a test pattern generating system.

According to one aspect of the invention, a test pattern generating method for a logical circuit comprises the steps of:

a step of selecting failures to be detected in said logical circuit on which a test pattern is generated;

a step of selecting a target failure from all failures selected;

a step of generating a test pattern for detecting said target failure;

a step of performing a failure simulation on all selected failures by the generated test pattern; and a step of selecting the target failure from the failures not detected by said test pattern;

wherein said respective steps are repeated to obtain test patterns for detecting all selected failures.

In the preferred construction, the test pattern generating method, further comprises a step of deleting a redundancy test pattern, which has a low failure detection rate, from the test patterns for detecting said all failures, wherein the step of deleting a redundancy test pattern includes a step of selecting test patterns in order of low to high detection rates from the test patterns for detecting said all failures, a step of judging whether or not all failures which are detected by said selected test patterns are detected by other test patterns, and a step of deleting said selected test patterns if said all failures are detected by other test patterns.

In another preferred construction, the step of deleting a redundancy test pattern includes a step of selecting test patterns in order of low to high detection rates from the test patterns for detecting all failures, a step of judging whether or not all failures which are detected by said selected test patterns are detected by other test patterns, and a step of deleting said selected test patterns if said all failures are detected by other test patterns, wherein it is judged whether or not said all test patterns have been selected, and if not, the respective steps are repeated on unselected test patterns.

Also, the step of deleting a redundancy test pattern includes a step of selecting failures in order of few to many test patterns from said all failures, a step of selecting test patterns for detecting said selected failures, and a step of determining the selected test patterns as essential when the failures which are detected by said selected test patterns are not detected by other test patterns.

Also, the step of deleting a redundancy test pattern includes a step of selecting failures in order of few to many test patterns from failures to be selected among said all failures, a step of selecting test patterns for detecting said selected failures, a step of determining the selected test patterns as essential when the failures which are detected by said selected test patterns are not detected by other test patterns, and a step of removing the failures, which are detected by said selected test patterns, from said all failures and making selection from the remained failures, wherein the respective steps are repeated until said failures subject to the selection are not remained, to select the test patterns determined as essential.

According to another aspect of the invention, a test pattern generating system on a logical circuit comprises test pattern generating means for selecting a target failure from failures to be detected in said logical circuit on which test patterns are generated and for generating a test pattern for detecting said target failure;

failure simulation means for performing a failure simulation on said all failures by the generated test pattern;

failure recording means for recording said generated test pattern and the failure detected by said failure simulation in a corresponded form; and redundancy test pattern deleting means for deleting a redundancy test pattern having a low failure detection rate from all test patterns.

In the above-mentioned construction, the redundancy test pattern deleting means selects test patterns in order of low to high detection rates from the test patterns for detecting said all failures, judges whether or not all failures which are detected by said selected test patterns are detected by other test patterns, and if they are, deletes said selected test patterns as redundancy test patterns.

In the preferred construction, the redundancy test pattern deleting means selects failures in order of few to many test patterns from failures to be selected among said all failures, selects test patterns for detecting said selected failures, and determines the selected test patterns as essential when the failures which are detected by said selected test patterns are not detected by other test patterns.

In the preferred construction, the redundancy test pattern deleting means selects failures in order of few to many test patterns from failures to be selected among said all failures, selects test patterns for detecting said selected failures, determines the selected test patterns as essential when the failures which are detected by said selected test patterns are not detected by other test patterns, removes the failures, which are detected by said selected test patterns, from said all failures to make selection from the remained failures, and selects the test patterns determined as essential at the time when said failures subject to the selection are not remained.

According to the third aspect of the invention, the test pattern generating system on a logical circuit comprises a failure table for recording all failures to be detected in said logical circuit on which test patterns are generated and test patterns for detecting said failures in a corresponded form;

test pattern generating means for selecting a target failure from failures recorded in said failure table and for generating a test pattern for detecting said target failure;

failure simulation means for performing a failure simulation on said all failures by the generated test pattern;

recording means for recording said generated test pattern and the failure detected by said failure simulation in a corresponded form; and redundancy test pattern deleting means for deleting a redundancy test pattern having a low failure detection rate from all test patterns.

In the preferred construction, the test pattern generating system, further comprises failure table control means for renewing the failures detected by said failure simulation as the detected failures among all failures recorded in said failure table, and means for selecting said target failure from undetected failures among all failures recorded in said failure table.

In another preferred construction, the redundancy test pattern deleting means selects test patterns in order of low to high detection rates from the test patterns for detecting said all failures, judges whether or not all failures which are detected by said selected test patterns are detected by other test patterns, and if they are, deletes said selected test patterns as redundancy test patterns.

Also, the redundancy test pattern deleting means selects failures in order of few to many test patterns from failures to be selected among said all failures, selects test patterns for detecting said selected failures, determines the selected test patterns as essential when the failures which are detected by said selected test patterns are not detected by other test patterns, removes the failures, which are detected by said selected test patterns, from said all failures to make selection from the remained failures, and selects the test patterns determined as essential at the time when said failures subject to the selection are not remained.

Other objects, features and effects of the present invention will be apparent from the following detailed description.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 5 is a diagram showing an example of the failure table prepared by the generation of a test pattern in an embodiment of the invention.

Figure 8:
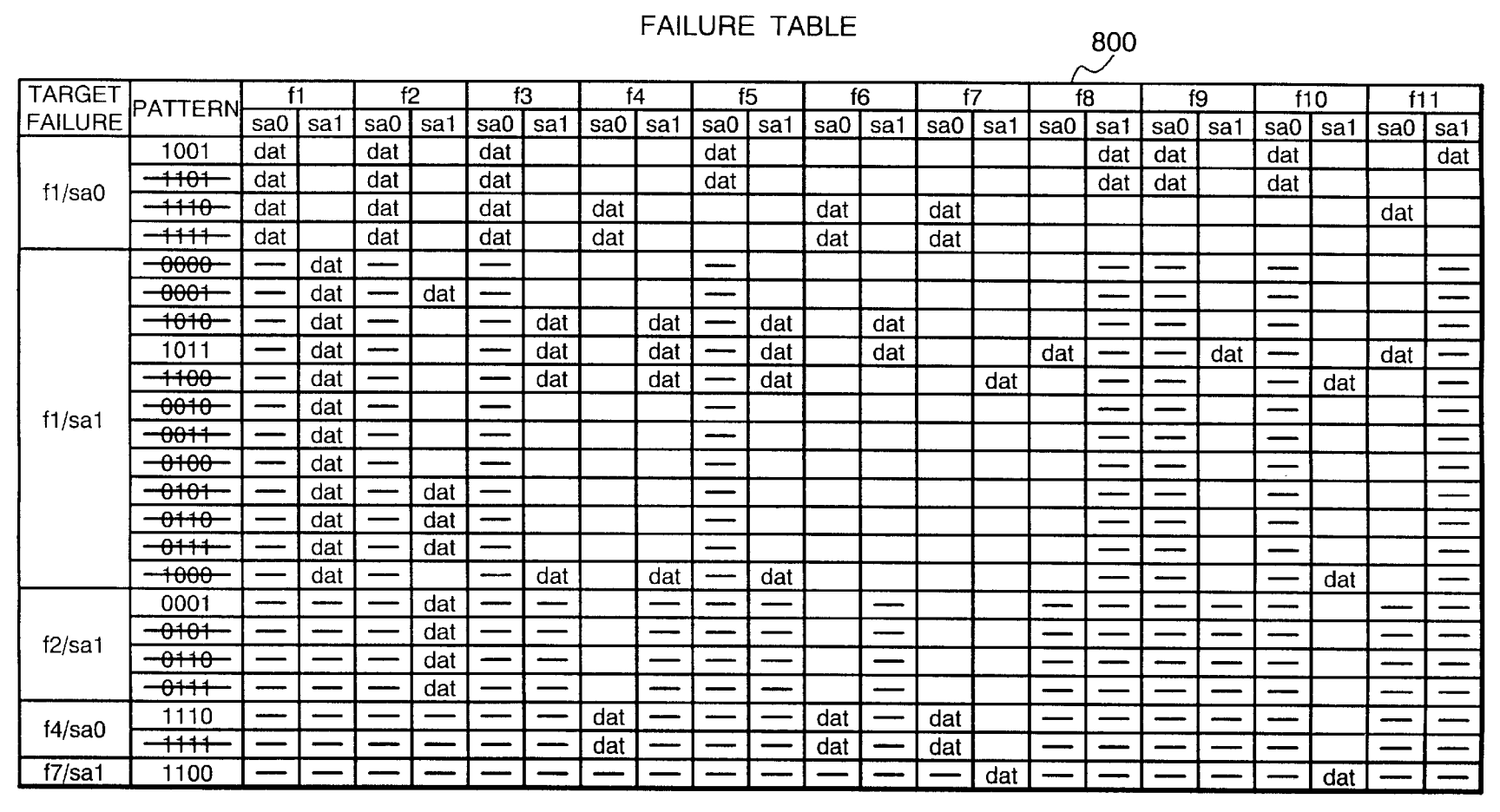

FIG. 8 is a diagram showing an example of the failure table to be prepared by a conventional test pattern generation.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to present unnecessarily obscuring the present invention.

The principle of the invention will be described below. Generally, the failure simulation needs a very long time (simulation calculation time). Therefore, the present invention decreases the failure simulation time by the configuration to be described afterward, thereby enabling generation of the test patterns in a short time.

The present invention can generate a test pattern without lowering a failure detection rate as compared with a conventional test pattern generating method. In other words, the above conventional test pattern generating method generates all patterns for detecting a target failure, performs the failure simulation on the respective patterns, and selects a pattern having the highest failure detection rate from the respective patterns, so that the number of failure simulations is necessarily increased.

On the other hand, the present invention generates first a single test pattern for detecting a target failure, then sequentially generates patterns one by one for detecting undetected failures. After that, a test pattern which has a low failure detection rate and can be replaced with another pattern without effecting on the whole failure detection rate is deleted. Thus, the test patterns are decreased without lowering the failure detection rate, and the time required for generating the test patterns is shortened.

Figure 1:
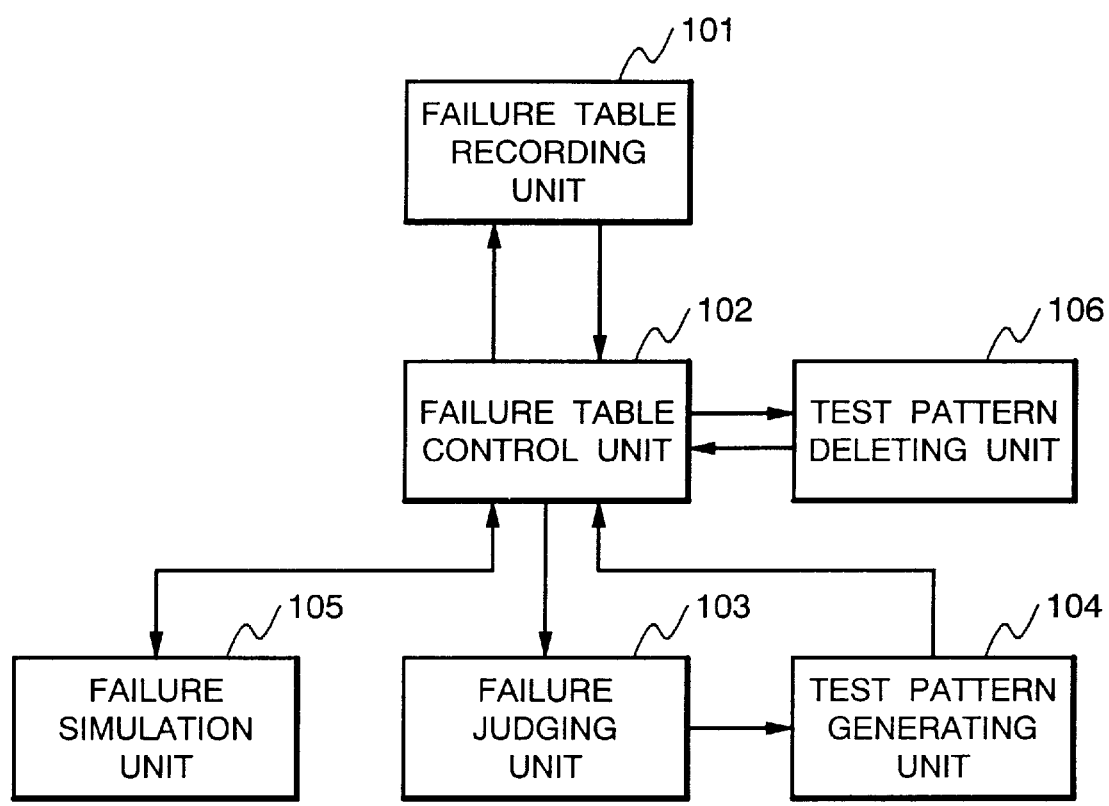
FIG. 1 is a block diagram showing the whole configuration of a test pattern generating system according to an embodiment of the invention.

Preferred embodiments of the invention will be described with reference to the accompanying drawings. FIG. 1 shows the whole configuration of a test pattern generating system according to an embodiment of the invention. In FIG. 1, the test pattern generating system comprises a failure table recording unit 101 for recording a failure table 500 as shown in FIG. 5, a failure table control unit 102 for preparing the failure table 500 into the failure table recording unit 101 and for renewing the failure table 500, a failure judging unit 103 for judging whether or not a defined failure has been detected by a test pattern and for selecting a target failure, a test pattern generating unit 104 for generating a test pattern to detect the target failure, a failure simulation unit 105 for performing a failure simulation by the generated test pattern, and a test pattern deleting unit 106 for deleting a redundancy test pattern from the test patterns recorded in the failure table 500.

The failure table 500 records the generated test patterns and the failures detected by such test patterns in a corresponded form.

Figure 2:
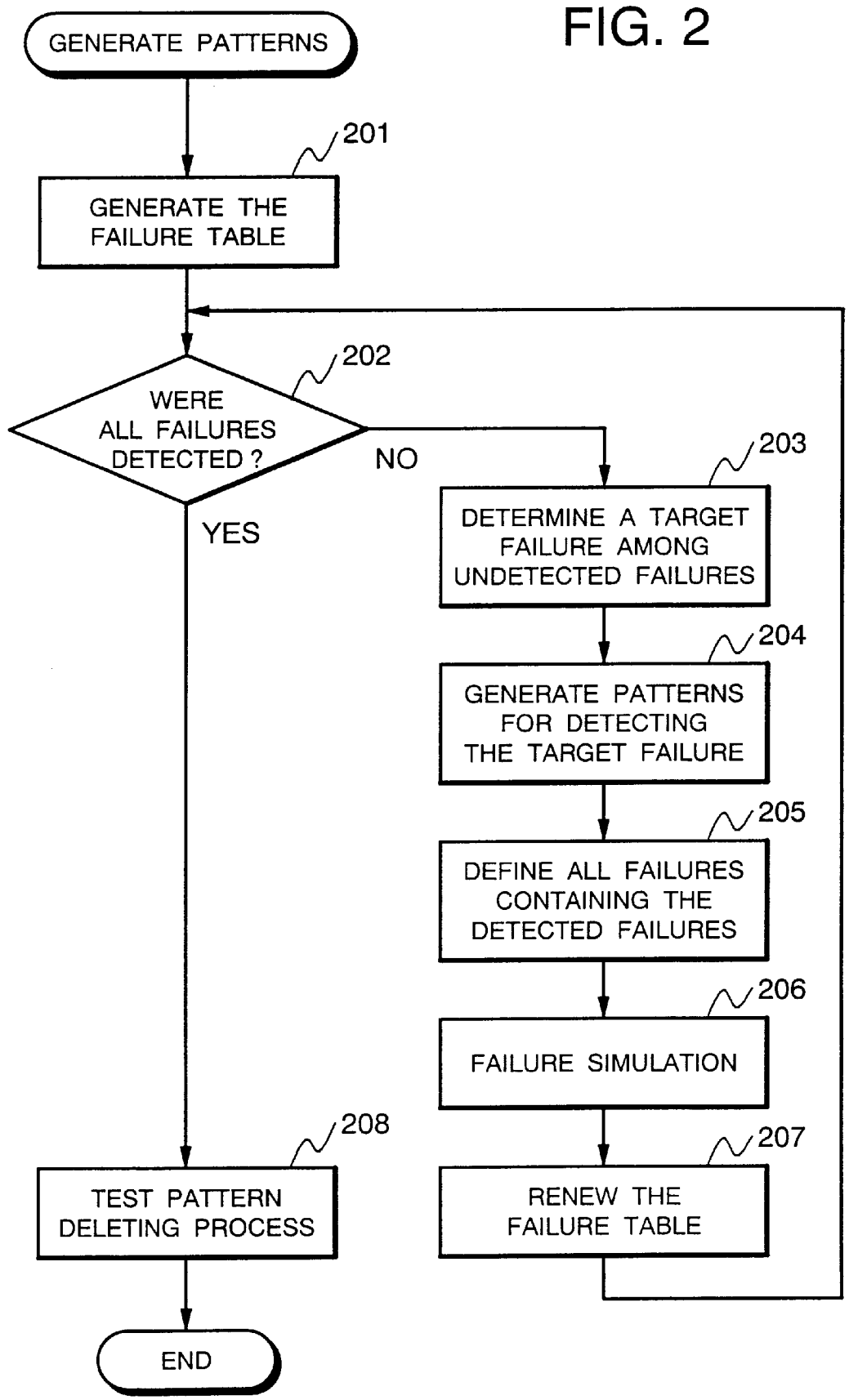
FIG. 2 is a flowchart for describing the process of a test pattern generating method according to an embodiment of the invention.
Figure 3:
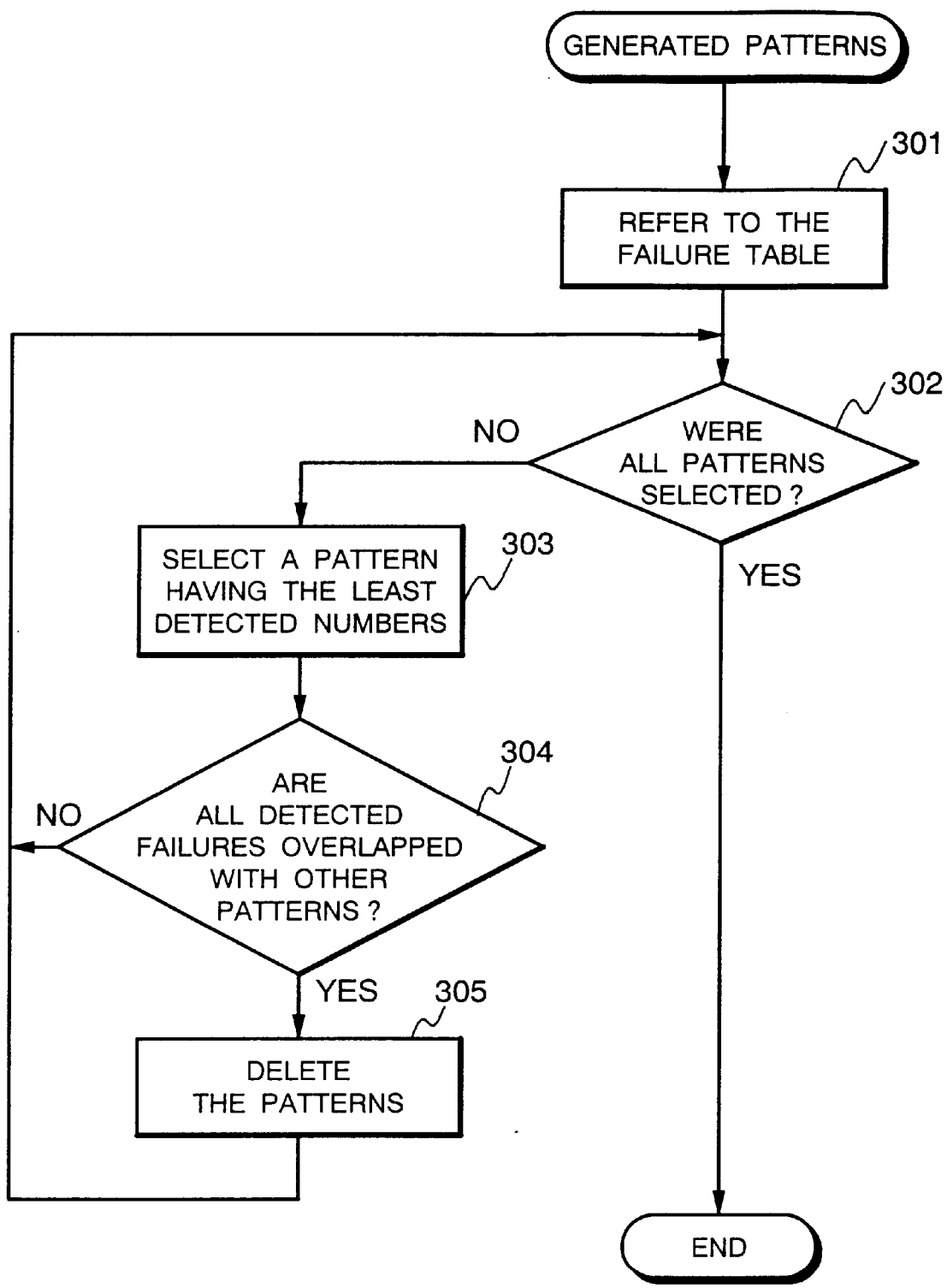
FIG. 3 is a flowchart for describing a first processing method by the test pattern deleting means in a first embodiment.
Figure 7:
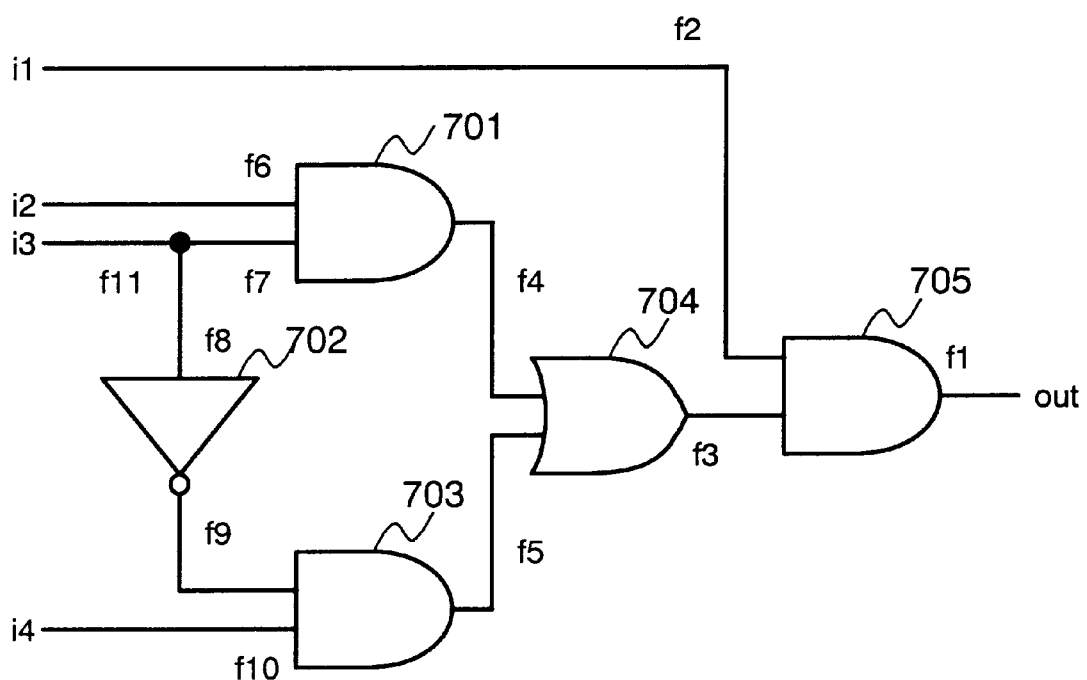
FIG. 7 is a circuit diagram showing an example of the logical circuit on which the test patterns are generated.

Referring to FIG. 2 and FIG. 3, the detailed process by the test pattern generating system according to an embodiment of the invention will be described. In the embodiment, the logical circuit shown in FIG. 7 is used as a logical circuit subjected to the generation of a test pattern.

In the test pattern generating process shown in FIG. 2, the failure table 500 as shown in FIG. 5 is prepared for a logical circuit to generate a test pattern in step 201. The failure table 500 defines a 0 degeneracy failure (hereinafter called "sa0") and a 1 degeneracy failure (hereinafter called "sa1") to inputs and outputs at all gates of the logical circuit shown in FIG. 7.

In step 202, the failure judging unit 103 judges whether or not all defined failures have been detected, and if not, a target failure is determined and taken from the undetected failures in step 203.

First, the 0 degeneracy failure (f1/sa0) at the output f1 of the AND gate G705 is determined as the target failure, and a test pattern for detecting the target failure (f1/sa0) is generated by the test pattern generating unit 104 (step 204).

Since the test pattern which can detect the failure (f1/sa0) is (i1, i2, i3, i4)=(1, 0, 0, 1), this test pattern is determined as a test pattern for detecting the failure (f1/sa0), the failure definition is made by the failure simulation unit 105 on all failures including the failure already detected (step 205), and the failure simulation is performed (step 206).

By this detecting test pattern, eight failures (f1/sa0), (f2/sa0), (f3/sa0), (f5/sa0), (f8/sa0), (f9/sa0), (f10/sa0) and (f11/sa0) are detected at the same time. Therefore, as to the respective failures detected by the test pattern (1, 0, 0, 1), the failure table control unit 102 records a code "det" for indicating the failure detection in a pertinent column in the failure table 500 to renew the failure table 500 (step 207).

Then, it is judged whether or not all the failures defined in step 202 have been detected. In this case, since there are undetected failures, the undetected failure (f1/sa1) is selected and determined as the target failure in step 203, and a test pattern is generated in step 204.

Since the test pattern which can detect the failure (f1/sa1) is (i1, i2, i3, i4)=(0, 0, 0, 0), it is determined as the test pattern for detecting the failure (f1/sa1), the failure definition is made on all failures including the failures already detected (step 205), and the failure simulation is performed (step 206).

Since a single failure (f1/sa1) is detected by this detecting test pattern, "det" is recorded in the failure table 500 with respect to the failure (f1/sa1) detected by the test pattern (0, 0, 0, 0) in step 207.

Then, according to the process shown in FIG. 2, the above-described process is repeated until all failures are detected (step 202).

In this embodiment, the 0 degeneracy failure and the 1 degeneracy failure at the inputs and outputs of all gates can be detected by seven test patterns (i1, i2, i3, i4)=(1, 0, 0, 1), (0, 0, 0, 0), (0, 0, 0, 1), (1, 0, 1, 0), (1, 1, 1, 0), (1, 1, 0, 0) and (1, 0, 1, 1) shown in the failure table 500 of FIG. 5. These seven test patterns are determined as the reference test pattern. By using these reference test patterns, the redundancy test pattern is deleted by the test pattern deleting unit 106 (step 208).

Now, description will be made of a first method of deleting the redundancy test pattern by the test pattern deleting unit 106 (step 208) with reference to the flowchart of FIG. 3 and the failure table 500 of FIG. 5.

When it is judged in step 202 of FIG. 2 that all failures have been detected, the redundancy test pattern is deleted in step 208 by the process shown in FIG. 3 with the seven test patterns generated by the above-described test pattern generation as the reference test patterns.

First, the failure table 500 for the logical circuit on which the test patterns are generated is referred to in step 301.

It is judged in step 302 whether or not all reference test patterns have been selected, and if not, a test pattern (0, 0, 0, 0), which has the least failure detection numbers, is selected from the unselected reference test patterns (step 303).

The failure table 500 of FIG. 5 is referred to judge whether or not all failures (f1/sa1) which are detected by this reference test pattern (0, 0, 0, 0) can be detected by other test patterns (step 304).

The failure (f1/sa1) can be detected by test patterns (0, 0, 0, 1), (1, 0, 1, 0), (1, 1, 0, 0) and (1, 0, 1, 1) in addition to the test pattern (0, 0, 0, 0), so that this test pattern (0, 0, 0, 0) is judged to be deletable and deleted (step 305).

Then, it is judged in step 302 whether or not all reference test patterns have been selected, and when there are unselected test patterns, a test pattern (0, 0, 0, 1) which has the least failure detection numbers is selected from the unselected test patterns (step 303).

The failure table 500 of FIG. 5 is referred to judge whether or not all failures (f1/sa1, f2/sa1) which are detected by this test pattern (0, 0, 0, 1) can be detected by other test patterns (step 304).

Among the failures which can be detected by the test pattern (0, 0, 0, 1), the failure (f2/sa1) cannot be detected by other test patterns, so that this test pattern (0, 0, 0, 1) is not deleted.

Then, according to the flowchart shown in FIG. 3, the above-described process is repeated until all test patterns are selected (step 302).

For example, the test pattern (1, 0, 1, 0) having the least failure detection numbers which is next to be selected from the unselected test patterns is deleted in step 305 because all failures (f1/sa1), (f3/sa1), (f4/sa1), (f5/sa1) and (f6/sa1) which are detected by the test pattern (1, 0, 1, 0) can be detected by other test patterns.

And, the test pattern (1, 1, 1, 0) having the least failure detection numbers which is next detected from the unselected test patterns is not deleted in step 305 because, among the failures (f1/sa0), (f2/sa0), (f3/sa0), (f4/sa0), (f6/sa0), (f7/sa0) and (f11/sa0) which are detected by the test pattern (1, 1, 1, 0), the failures (f4/sa0), (f6/sa0) and (f7/sa0) cannot be detected by other test patterns.

In the same way, the unselected test patterns (1, 1, 0, 0), (1, 0, 0, 1) and (1, 0, 1, 1) are not deleted because they cannot be detected by other test patterns.

Figure 4:
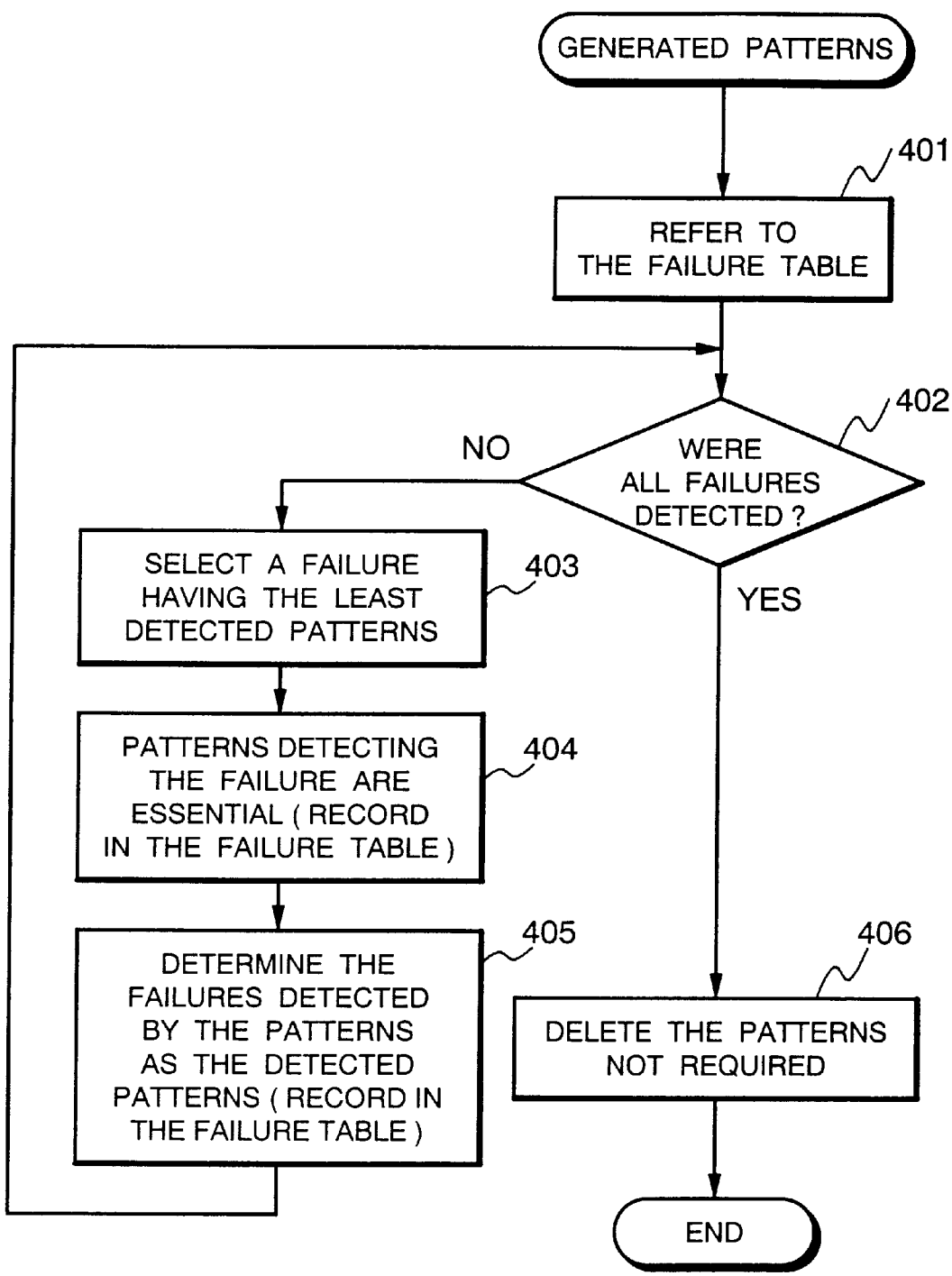
FIG. 4 is a flowchart for describing a second processing method by the test pattern deleting means.
Figure 6:
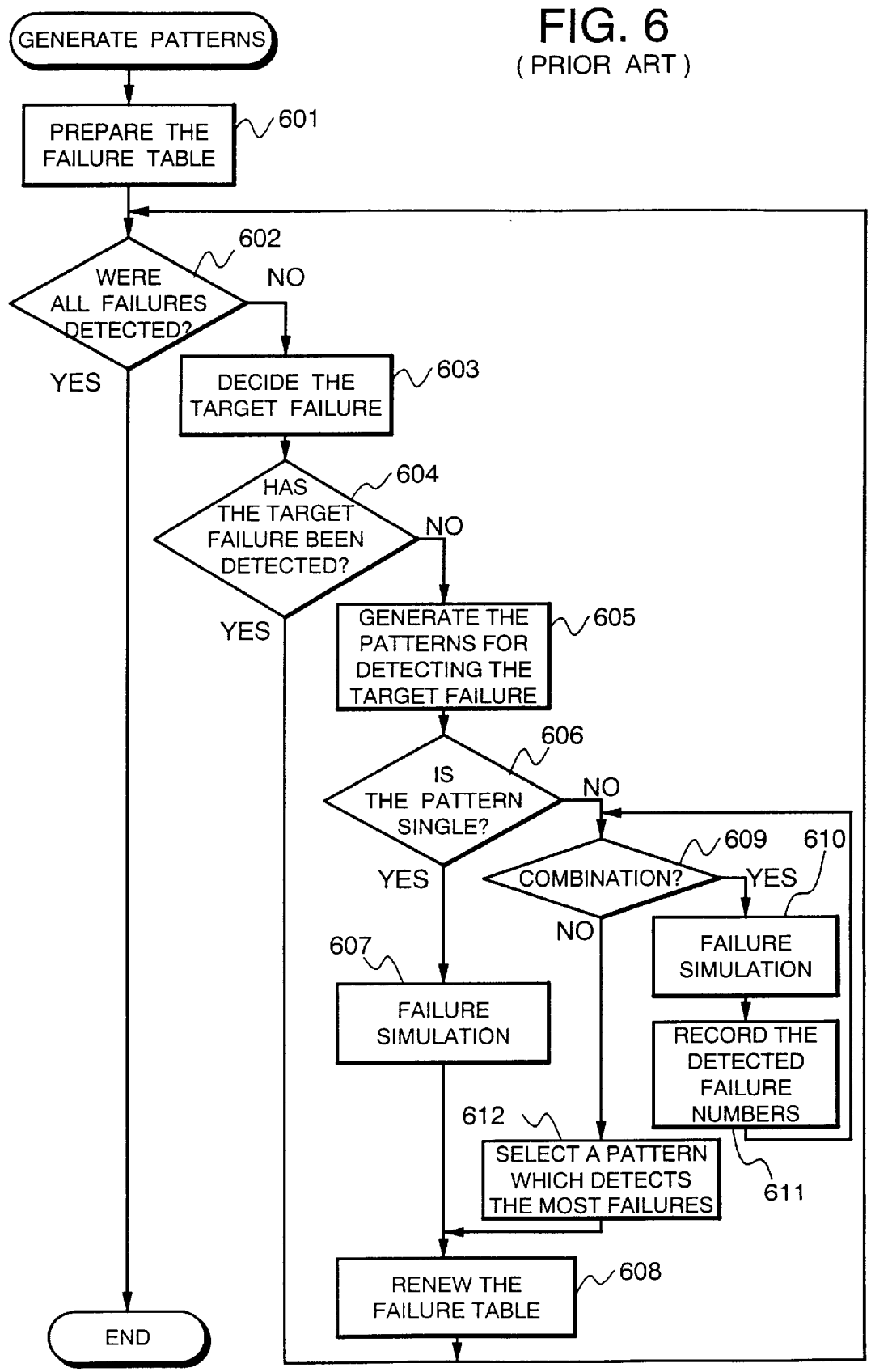
FIG. 6 is a flowchart for describing the process of a conventional test pattern generating method.

In the embodiment shown in FIG. 4, the test patterns which are generated through the process by test pattern deleting means are five of (i1, i2, i3, i4)=(1, 0, 0, 1), (0, 0, 0, 1), (1, 1, 1, 0), (1, 1, 0, 0) and (1, 0, 1, 1).

Now, description will be made of a second method of deleting the redundancy test pattern by the test pattern deleting unit 106 (step 208) with reference to the flowchart shown in FIG. 4 and the failure table 500 shown in FIG. 5.

As described above, in the test pattern deleting process (step 108), the redundancy test pattern is deleted with reference to the seven test patterns generated by the above-described test pattern generation.

First, the failure table 500 for the logical circuit on which the test patterns are generated is referred to in step 401.

It is judged in step 402 whether or not all failures have been detected, and if not, a failure (in this case, the failure (f2/sa1) detected by a single test pattern) having the least detected test pattern numbers is selected from the undetected failures (step 403).

It is recorded in the failure table 500 (step 404) that the test pattern (0, 0, 0, 1) which detects this failure (f2/sa1) is essential because no other test patterns detect it, and another failure (namely, the failure (f1/sa1)) detected by this test pattern (0, 0, 0, 1) is recorded as the detected failure in the failure table 500 (step 405).

Then, it is judged in step 402 whether or not all failures have been detected, and if not, a failure (in this case, the failure (f4/sa0) detected by a single test pattern) having the least detected test pattern numbers is selected from the undetected failures (step 403).

It is recorded in the failure table 500 (step 404) that the test pattern (1, 1, 1, 0) which detects this failure (f4/sa0) is essential because no other test patterns detect it, and other failures (f1/sa0, f2/sa0, f3/sa0, f6/sa0, f7/sa0 and f11/sa0) detected by this test pattern (1, 1, 1, 0) are recorded as the detected failures in the failure table 500 (step 405).

Then, according to the process shown in FIG. 3, the above-described process is repeated until all failures are detected (step 402).

When all failures have been detected by the above process, the test patterns which have not been judged as essential are deleted as the redundancy test patterns from the reference test patterns in step 406. Specifically, the test patterns (0, 0, 0, 0) and (1, 0, 1, 0) are deleted as the redundancy test patterns from the reference test patterns in FIG. 5.

As a result, the test patterns generated by means of the test pattern deleting means in this embodiment are five of (i1, i2, i3, i4)=(1, 0, 0, 1), (0, 0, 0, 1), (1, 1, 1, 0), (1, 1, 0, 0) and (1, 0, 1, 1) as shown in FIG. 5.

As described above, the present invention generates a single test pattern for detecting a target failure, and generates patterns one by one for detecting undetected failures. After that, a test pattern which has a low failure detection rate and can be replaced with another pattern without effecting on the whole failure detection rate is deleted. Thus, the test patterns are decreased without lowering the failure detection rate, and the time required for generating the test patterns can be shortened. Thus, the invention has an effect of generating the test patterns having a good failure detection efficiency in a short time.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A test pattern generating method for a logic circuit, comprising the steps of:
   selecting failures to be detected in a logic circuit;
   selecting a target failure from said selected failures;
   generating a test pattern for detecting said target failure;
   performing a failure simulation on said selected failures using said generated test pattern to determine which failures are detected by said generated test pattern;
   selecting another target failure from said selected failures which are not detected by said failure simulation using said test pattern, wherein said steps of generating a test pattern, performing a failure simulation, and selecting another target failure are repeated until test patterns are generated for detecting all of said selected failures; and
   deleting a redundant test pattern, which has a low failure detection rate, from the test patterns for detecting all of said selected failures.

2. The test pattern generating method as set forth in claim 1, wherein said step of deleting a redundant test pattern includes:
   selecting test patterns in order of low to high detection rates from the test patterns for detecting all of said selected failures,
   judging whether or not all of the failures which are detected by said selected test patterns are detected by other test patterns, and
   deleting said selected test patterns if all of the failures which are detected by said selected test patterns are detected by other test patterns.

3. The test pattern generating method as set forth in claim 1, wherein said step of deleting a redundant test pattern includes:
   selecting test patterns in order of low to high detection rates from the test patterns for detecting all of said selected failures,
   judging whether or not all of the failures which are detected by said selected test patterns are detected by other test patterns, and
   deleting said selected test patterns if said all of the failures which are detected by said selected test patterns are detected by other test patterns,
   wherein it is judged whether or not all of said test patterns have been selected, and if not, said respective steps are repeated on unselected test patterns.

4. The test pattern generating method as set forth in claim 1, wherein said step of deleting a redundant test pattern includes:
   selecting failures in order of few to many test patterns from all of said selected failures,
   selecting test patterns for detecting said selected failures, and
   determining the selected test patterns as essential when the failures which are detected by said selected test patterns are not detected by other test patterns.

5. The test pattern generating method as set forth in claim 1, wherein said step of deleting a redundant test pattern includes:
   selecting failures in order of few to many test patterns from failures to be selected among all of said selected failures,
   selecting test patterns for detecting said selected failures,
   determining the selected test patterns as essential when the failures which are detected by said selected test patterns are not detected by other test patterns, and
   removing the failures, which are detected by said selected test patterns, from said all failures and making selection from the failures which remain,
   wherein said respective steps are repeated until none of said failures subject to the selection remain, to select the test patterns determined as essential.

6. A test pattern generating system on a logical circuit comprising:
   a test pattern generator for selecting a target failure from failures to be detected in a logical circuit on which test patterns are generated and for generating a test pattern for detecting said target failure;
   a failure simulator for performing a failure simulation on all of said failures to be detected using said generated test pattern to determine which failures are detected by said generated test pattern;
   a failure recorder for recording said generated test pattern and failures which are detected by said failure simulation using said generated test pattern in a corresponding format; and
   redundant test pattern deleting means for deleting a redundant test pattern having a low failure detection rate from all test patterns generated by said test pattern generator.

7. The test pattern generating system as set forth in claim 6, wherein
   said redundant test pattern deleting means selects test patterns in order of low to high detection rates from the test patterns for detecting all of said failures to be detected, judges whether or not all failures which are detected by said selected test patterns are detected by other test patterns, and if they are, deletes said selected test patterns as redundant test patterns.

8. The test pattern generating system as set forth in claim 6, wherein
   said redundant test pattern deleting means selects failures in order of few to many test patterns from failures to be selected among all of said failures to be detected, selects test patterns for detecting said selected failures, and determines the selected test patterns as essential when the failures which are detected by said selected test patterns are not detected by other test patterns.

9. The test pattern generating system as set forth in claim 6, wherein
   said redundant test pattern deleting means selects failures in order of few to many test patterns from failures to be selected among all of said failures to be detected, selects test patterns for detecting said selected failures, determines the selected test patterns as essential when the failures which are detected by said selected test patterns are not detected by other test patterns, removes the failures, which are detected by said selected test patterns, from all of said failures to be detected to make selection from the failures which remain, and selects the test patterns determined as essential at the time when said failures subject to the selection are not remaining.

10. A test pattern generating system on a logical circuit comprising:
- a failure table for recording failures to be detected in a logical circuit on which test patterns are generated and test patterns for detecting said failures in a corresponding form;
- a test pattern generator for selecting a target failure from failures recorded in said failure table and for generating a test pattern for detecting said target failure;
- a failure simulator for performing a failure simulation on all of said failures using the generated test pattern;
- a recorder for recording said generated test pattern and detected failures which are detected with said generated test pattern by said failure simulator; and
- redundant test pattern deleting means for deleting a redundant test pattern having a low failure detection rate from all test patterns generated by said test pattern generator.

11. The test pattern generating system as set forth in claim 10, further comprising:
- failure table control means for renewing the failures detected by said failure simulator as the detected failures among all of said failures recorded in said failure table, and
- means for selecting said target failure from undetected failures among all of said failures recorded in said failure table.

12. The test pattern generating system as set forth in claim 10, wherein
- said redundant test pattern deleting means selects test patterns in order of low to high detection rates from the test patterns for detecting all of said failures, judges whether or not all failures which are detected by said selected test patterns are detected by other test patterns, and if they are, deletes said selected test patterns as redundancy test patterns.

13. The test pattern generating system as set forth in claim 10, wherein
- said redundancy test pattern deleting means selects failures in order of few to many test patterns from failures to be selected among all of said failures, selects test patterns for detecting said selected failures, determines the selected test patterns as essential when the failures which are detected by said selected test patterns are not detected by other test patterns, removes the failures, which are detected by said selected test patterns, from said all failures to make selection from the failures which remain, and selects the test patterns determined as essential at the time when said failures subject to the selection are not remaining.

* * * * *